United States Patent [19]

Feinberg et al.

[11] 4,245,273

[45] Jan. 13, 1981

[54] PACKAGE FOR MOUNTING AND INTERCONNECTING A PLURALITY OF LARGE SCALE INTEGRATED SEMICONDUCTOR DEVICES

[75] Inventors: Irving Feinberg; Jack L. Langdon, both of Poughkeepsie, N.Y.

[73] Assignee: International Business Machines Corporation, Armonk, N.Y.

[21] Appl. No.: 53,477

[22] Filed: Jun. 29, 1979

[51] Int. Cl.³ .............................................. H05K 7/20
[52] U.S. Cl. ................................ 361/382; 361/385; 361/386; 357/82
[58] Field of Search ............... 361/382, 385, 381, 386, 361/403, 409, 410, 414, 416; 174/68.5; 357/82

[56] References Cited

U.S. PATENT DOCUMENTS

| | | | |
|---|---|---|---|
| 3,564,114 | 2/1971 | Blinder | 361/409 |
| 3,643,133 | 2/1972 | Towell | 361/409 |
| 3,726,002 | 4/1973 | Greenstein | 29/577 |
| 3,838,204 | 9/1974 | Ahn | 174/68.5 |
| 3,851,221 | 11/1974 | Beanliew et al. | 361/382 |
| 3,993,123 | 11/1976 | Chu et al. | 165/80 |
| 3,999,004 | 12/1976 | Chirino | 174/68.5 |
| 4,047,132 | 9/1977 | Krojewski | 361/414 |
| 4,150,421 | 4/1979 | Nishihara | 361/410 |

OTHER PUBLICATIONS

Integrated Circuit Int. & Packaging, IBM Tech. Discl. Bull., Finch et al., vol. 13, No. 4 Sep. 1970, p. 962.
A Fabrication Technique For Multilayer Ceramic Modules, Kaiser et al., Solid State Techn. May 1972, p. 35.

*Primary Examiner*—Gerald P. Tolin
*Attorney, Agent, or Firm*—Wolmar J. Stoffel

[57] ABSTRACT

A package for mounting, interconnecting, and cooling a large number of integrated circuit semiconductor devices having a sintered multilayer ceramic substrate provided with an internal metallurgy network made up of voltage planes, X and Y signal planes, and fan-out planes, with I/O pins on the bottom surface, and a plurality of asymmetrical solder pad clusters for flip chip bonding to a plurality of integrated circuit devices on the top surface, a plurality of integrated circuit devices bonded to the solder pad clusters, at least one row elongated engineering change pads surrounding each pad cluster, each pad provided with a severable surface link, the I/O pins connected to the internal network of the substrate and arranged in clusters with the powering voltages of each device located directly beneath the device thereby minimizing voltage drop, and signal voltages inputted through the I/O pins interspersed between the clusters of power pins, a cap for forming an enclosure over at least the top surface of the ceramic substrate, and a liquid cooling means associated with the cap for removing heat from the devices.

5 Claims, 6 Drawing Figures

PACKAGE FOR MOUNTING AND INTERCONNECTING A PLURALITY OF LARGE SCALE INTEGRATED SEMICONDUCTOR DEVICES

TECHNICAL FIELD

This invention relates to multilayer printed circuit semiconductor packages, and more particularly to fired multilayer ceramic substrates adapted to interconnect a plurality of large scale integrated circuit chips mounted on the substrate and the input/output pins of the substrate.

An object of the present invention is to provide an improved semiconductor package having a laminated multilayer ceramic substrate provided with internal wiring having controlled capacitance and impedance characteristics.

Another object of this invention is to provide a multilayer ceramic substrate for a semiconductor package that will interconnect large numbers of integrated circuit semiconductor devices mounted on the substrate.

Yet another object of this invention is to provide a package structure which provides the combined function of the conventional module containing the semiconductor devices, and the cards and boards normally used to interconnect them.

Yet another object of this invention is to provide a new and improved semiconductor package that is capable of interconnecting large numbers of integrated circuit semiconductor devices where the devices are interconnected with relatively short conductive lines and which provides the cooling facilities for maintaining the temperatures at a safe operating level.

BACKGROUND ART

Laminated multilayer boards provided with internal wiring are well known as illustrated and described in U.S. Pat. No. 3,564,114. Multilayer ceramic substrates capable of mounting and interconnecting a plurality of semiconductor devices are also well known as indicated by an article entitled "A Fabrication Technique For Multilayer Ceramic Modules" by H. D. Keiser, et al in *Solid State Technology* May 1972 P. 35–40. In this technology green sheets of ceramic, i.e., ceramic powder held together in sheet form by temporary organic binder are metallized with noble or refractory metals, usually by screen printing. The metallized sheets are stacked, laminated, and fired to form a monolithic metal package. This technology affords an opportunity to do three-dimensional wiring in what was formerly waste or inexcessible space in a ceramic substrate. The use of this "waste space" results in the creation of the high-density, sturdy electronic package with good performance and reliability. With the advent of microminiaturized large-scale integrated circuit semiconductor devices with their accompanying faster speeds of operation, the compatability of the substrate and the devices supported thereon become increasingly important. In order to control and predict the operating characteristics of the substrate such as signal delay, cross-talk, etc., it becomes increasingly important to control the impedance and capacitance characteristics of the internal wiring, as well as the length. The increased density of the semiconductor devices also imposes formidable cooling requirements in order to maintain the temperature of the devices at a safe operating range during operation.

BRIEF DESCRIPTION OF THE DRAWINGS

In the accompanying drawings forming a material part of this disclosure

DISCLOSURE OF INVENTION

For further comprehension of the invention and the obvious advantages thereto, a reference will be had to the following description and accompanying drawings and to the appended claims in which the various novel features of the invention are more particularly set forth.

Figure 1:
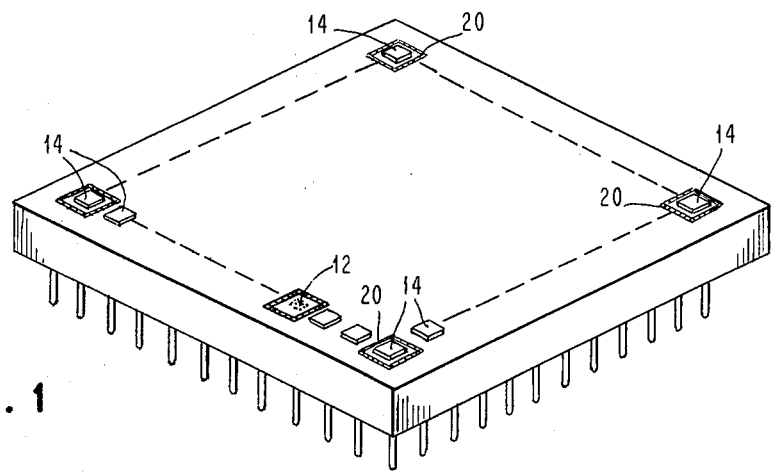
FIG. 1 is a perspective view of a multilayer ceramic substrate embodied in the overall package of the invention.
Figure 2:
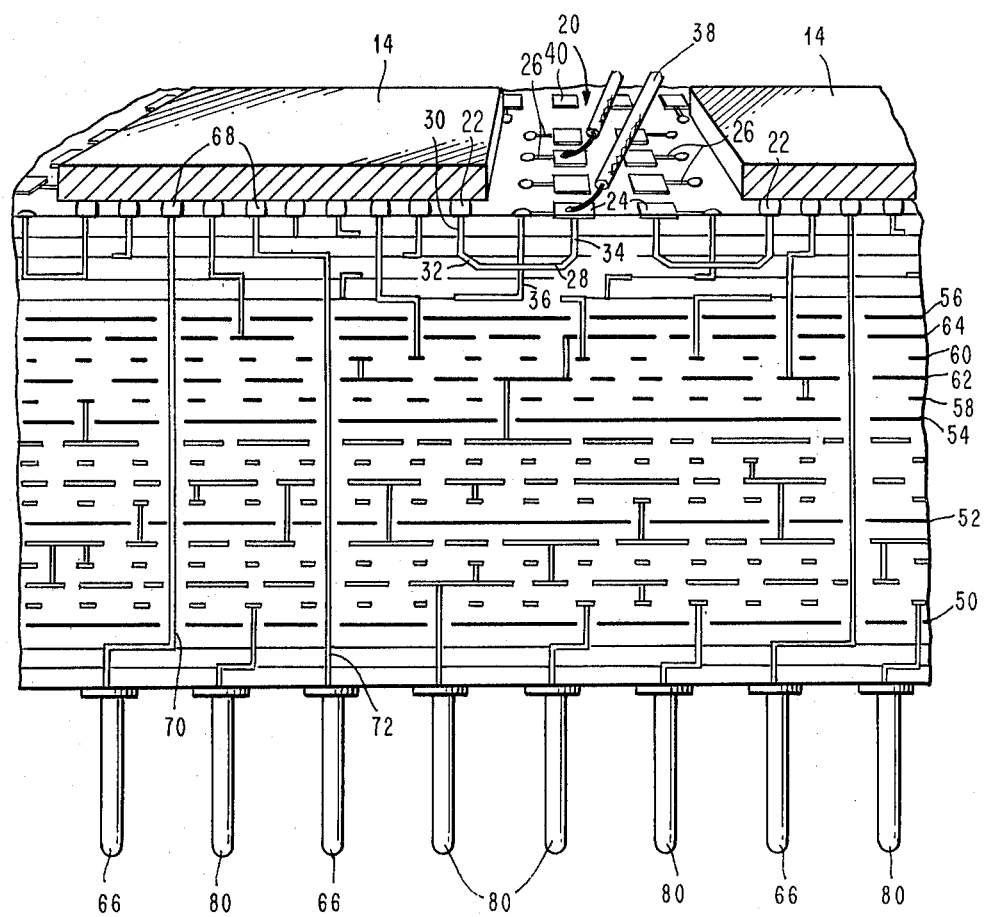
FIG. 2 is a perspective view in broken section of the substrate illustrated in FIG. 1 showing a typical internal conductive network including wiring planes, engineering change pads on the surface, etc.
Figure 3:
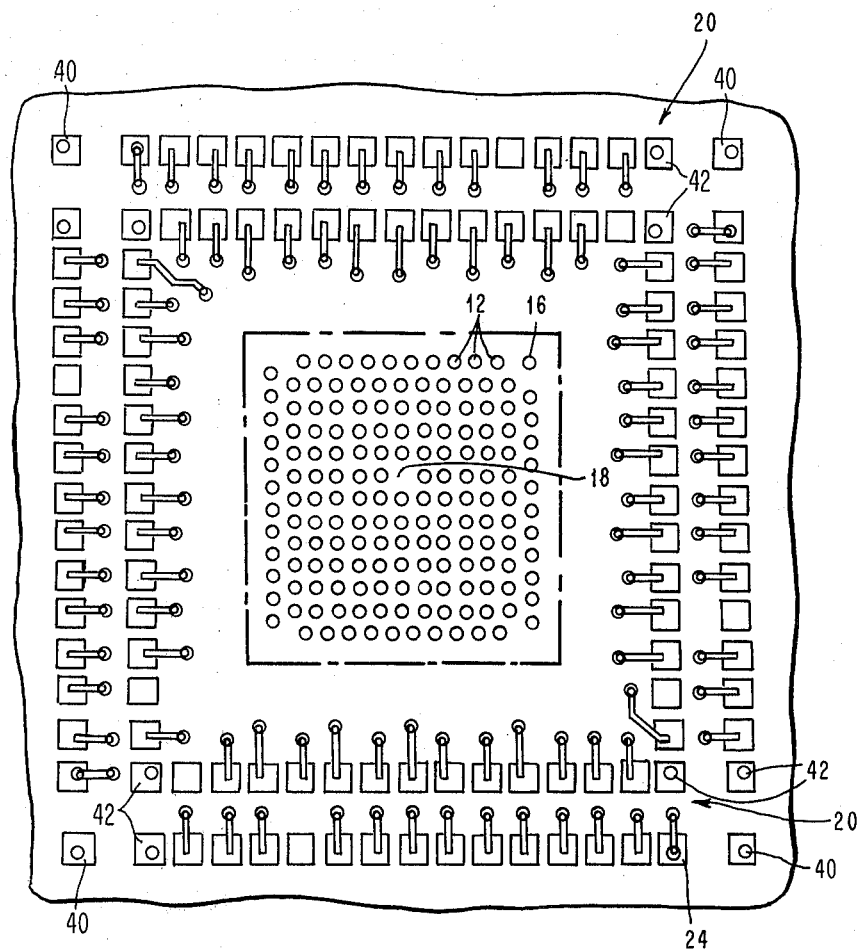
FIG. 3 is a top plan view illustrating the asymmetrical solder pad pattern and the surrounding engineering change pads.

Referring now to FIG. 1 of the drawings, there is illustrated a typical laminated multilayer ceramic substrate used in the package of the invention. The substrate 10 can be any suitable size to accommodate the desired number of devices, preferably the devices number on the order of 100 or more. The substrate 10 is formed in the manner described in the Background section of this specification. The material of the substrate is chosen so that the thermal expansion matches or is a close match to the silicon material of the devices to be mounted on the substrate. The top surface of substrate 10 is provided with a plurality of solder pads 12, more clearly shown in FIG. 3, adapted to be joined to a corresponding pattern of solder pads on a semiconductor device 14. Any suitable number of devices can be mounted on the substrate 10 typically on the order of 100 or more. As more clearly illustrated in FIG. 3, the pattern of the solder pads 12 is asymmetrical. In the prefered embodiment illustrated in FIG. 3, the pad 16 is moved to the corner of the pattern from space 18. If pad 16 were repositioned in space 18, the pattern would be symmetrical. The advantage of providing an asymmetrical pattern is that the device 14 can be joined in only one position. Surrounding each of the cluster of solder pads 12 are 1 or more rows of engineering change pads 20. As more clearly illustrated in FIG. 2, the rows of engineering change pads 20 provide easy access to the terminals 22 of device 14. In actual practice each of the signal input/output terminals of device 14 is provided with an engineering change pad. A typical engineering change pad has a pad portion 24 and a severable link portion 26. As shown in FIG. 2 the pad portion 24 is joined to device terminal 22 with a conductive stripe 28. Stripe 28 consists of vertically extending metallurgy 30 which extends through one or more via holes in one or more ceramic layers, a stripe portion 32 imprinted on the surface of a green sheet, and another vertical portion 34 also consisting of filled via holes in one or more sheets of ceramic. The ends of severable links 26 are connected to the internal metallurgy network of the substrate by a conductive line 36. In use the engineering change pads 24 can be used to test the circuitry of the module and also the device connections as well as the device. It can also be used to repair defects in the conductive metallurgy network of the device. Repairs can be made by bonding a wire 38 to pad 24 and joining the other end to another similar engineering change pad. The deletable link 26 can be severed to isolate the pad 24 from the network in the event that it is defective or other changes in the network are to be made. Floating pads 40 are also provided to provide surfaces for joining intermediate lengths of line 38 or to provide additional locations to tap into the signal. Further, pads 42, joined to each other by underlying metallurgy, can also be used to provide locations for tapping into the voltage or the like. Since a limited number of wires can be bonded to each pad, this arrangement allows an additional tapping into various signals or voltages.

In order to control the impedance of the signal lines in the substrate and also to eliminate cross-talk, i.e., mutual inductance between lines, the conductive metallurgy transmitting signals are located between relatively solid conductive planes. As is conventional, conductive lines on a single plane extend only in one direction, i.e., X direction, and the lines on the plane below that extend only in the orthogonal or Y direction. As indicated in FIG. 2, solid planes 50, 52, 54 and 56 have sandwiched in their between four signal planes. More specifically, between planes 54 and 56 there are contained signal planes 58 and 60 with conductive lines extending in the X direction, and signal line planes 62 and 64 with lines extending in the Y direction. The relatively solid planes 54 and 56 are tied to voltages used to power devices 14. In this matter the electric fields contained in the signal planes 58, 60, 62 and 64 are contained or confined by planes 54 and 56. This plane arrangement is repeated in the associated planes as often as necessary. As an alternate embodiment, the voltage planes can be used to contain only two planes, i.e., an X plane and a Y signal plane.

Figure 4:
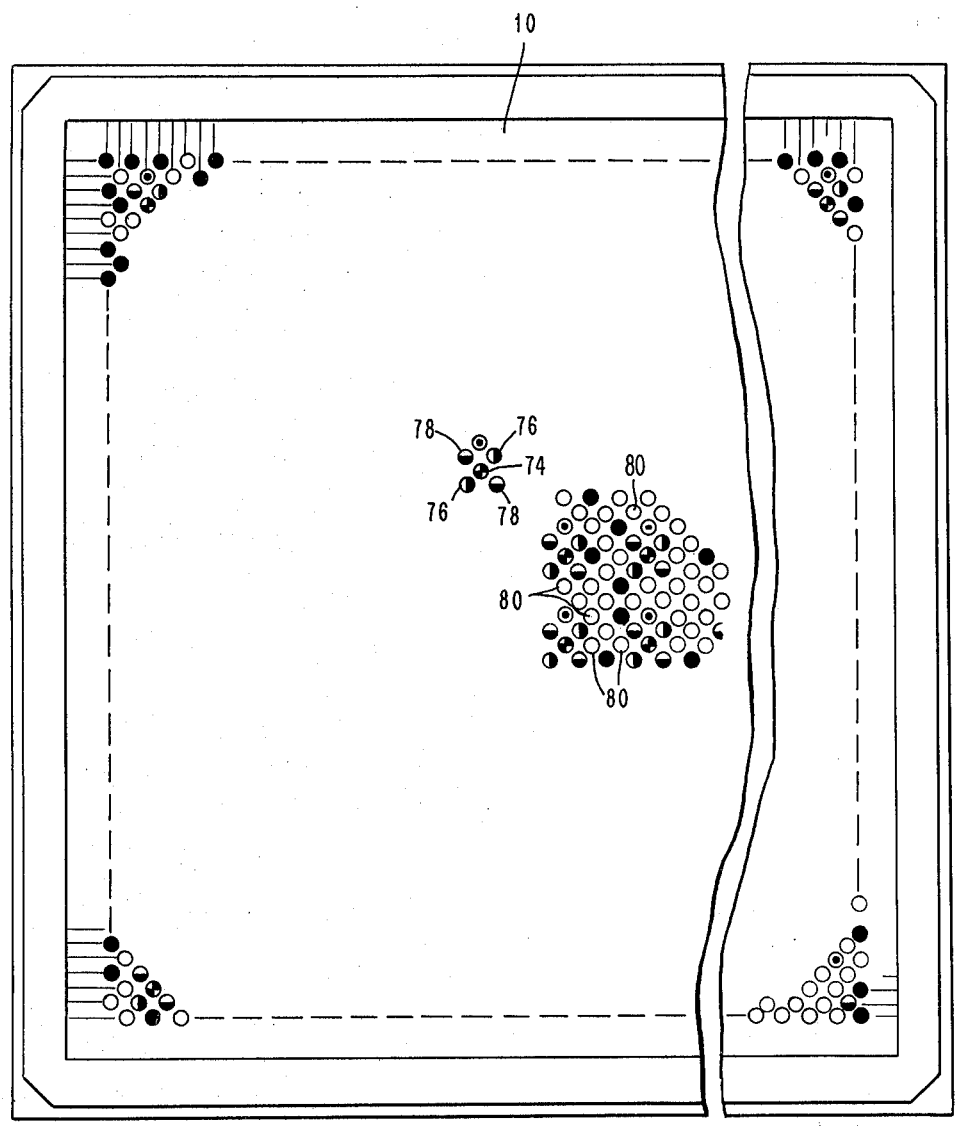
FIG. 4 is a bottom view of the substrate illustrating the novel I/O pin arrangement of the invention.

In order to further increase the speed of operation and reduce the parasitic capacitance between the various lines of the conductive network in substrate 10, a novel pin arrangement is illustrated in FIG. 4. In the substrate 10 of the invention the I/O pins on the bottom surface of the substrate are arranged so that a cluster of power pins are located directly under each semiconductor device mounted on the opposite side. Conductive lines from the power pins lead almost directly upward to the devices 14 on the opposite side. This is illustrated most clearly in FIG. 2 wherein power pins 66, located beneath device 14 are connected to power terminals 68 by conductive lines 70 and 72. This arrangement, in addition to providing optimum power distribution to each pad site by minimizing the voltage drop also reduces the inductance of the network when the surrounding pins contain signal voltages. In use, the voltages conducted by pins 66 are tied to appropriate power planes 50, 52, 54, or 56 by suitable connections not shown. Further all of the power pins under each of the devices are similarly connected. Thus if an open occurs in a conductive line between the pin and the power plane under one device, the voltages are still maintained at the device level. As shown in FIG. 4 a preferred pin cluster consists of a central pin 74 connected to one voltage, pins 76 connected to yet another voltage, and pins 78 connected to ground potential. Pins 80, coded white, are connected to signal lines which provide signals to the network and to the signal I/O of devices mounted on top of the substrate.

Figure 5:
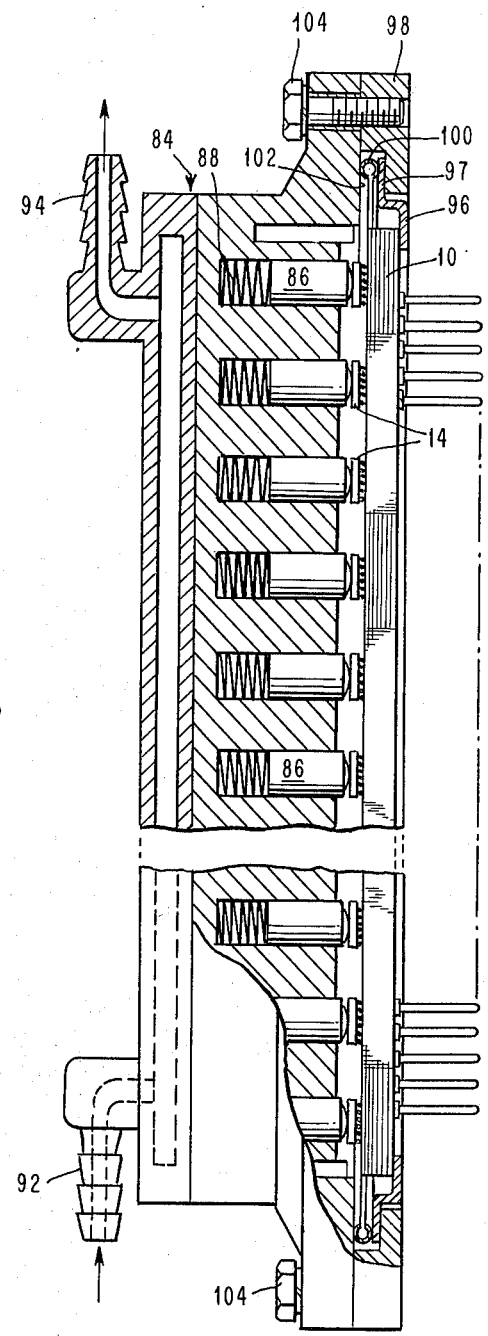
FIG. 5 is a side elevational view in broken section illustrating preferred embodiment of the cooling arrangement of the substrate package.

Referring now to FIG. 5 there is depicted a preferred specific embodiment of the cap structure for enclosing and cooling the semiconductor devices mounted on the top surface of substrate 10. The cap 84 has a plurality of conductive pistons 86 biased downwardly into contact with devices 14 by springs 88. Heat generated by the device 14 during operation is conducted away from the device to cap 84 and ultimately away through a cooling jacket 90 mounted on the top surface of the cap. Cooling jacket 90 has an inlet 92 and an outlet 94 in which a suitable cooling fluid can be circulated.

An effective seal arrangement between the substrate 10 and the cap is provided by a flange 96 that is brazed to the bottom surface of the substrate 10 on the inside and is seated on flat surface 97 of clamping ring 98. An annular sealing element 100 is disposed between the top surface of flange 96 and the bottom surface 102 of cap 84 thereby providing a sealed environment. Bolts 104 or other suitable means is provided to maintain the clamping element 98 in position to maintain the seal 100 in effective sealing association. The transfer of heat from the chips 14 to the pistons 86 may be augmented by providing in the enclosure a gas with high thermal conductivity such as Helium.

Figure 6:
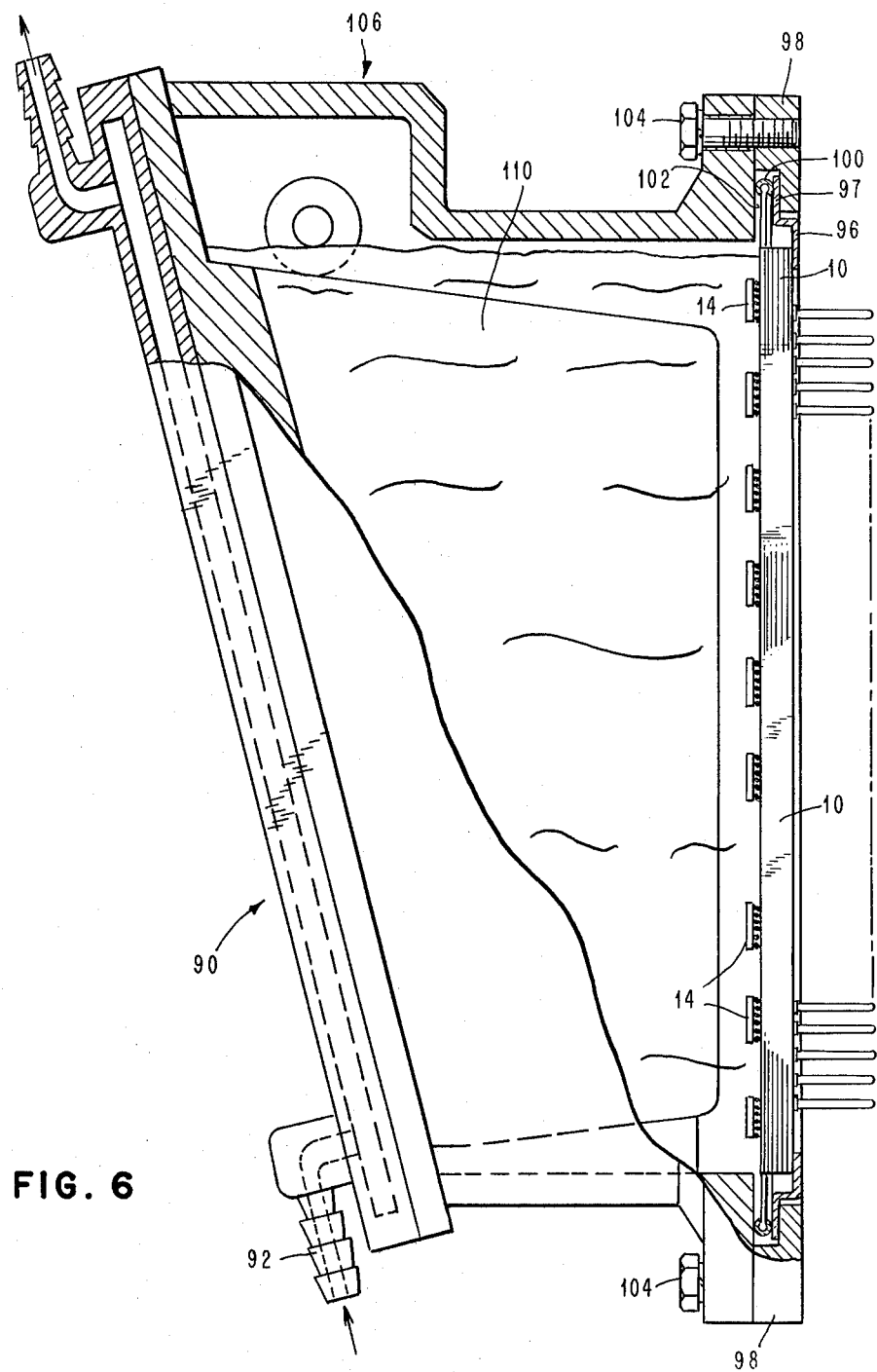
FIG. 6 is a side elevational view in broken section illustrating yet another preferred specific embodiment of the cooling arrangement for cooling the package of the invention.

FIG. 6 illustrates another preferred embodiment of the cooling arrangement of the invention. In this embodiment a cooling cap 106 is provided to contain a suitable cooling fluid 108 in which the devices 14 are immersed. During operation the heat generated by the devices 14 causes the liquid 108 to boil, thereby absorbing the heat. Fins 110 are provided to conduct the heat from the fluid 108 to a cooling plate 90. The sealing arrangement is basically the same as described in regard to the embodiment illustrated in FIG. 5.

The unique combination of features described in the foregoing specification of the package invention effectively eliminates at least one level of packaging. In computer applications, single chips are conventionally mounted on modules, the modules mounted on cards or directly on boards. The density of the connections decreases with each level proceeding from the device. In this package the chip protection and chip connection grid expansion functions of the device module and the circuitry of the cards and the board are combined in the package 10. The devices 14 are mounted and interconnected with each other as they would be in the device module and board circuitry. However, since the devices are mounted much closer together on the substrate 14 than they would be on modules, cards and boards, the signal paths between the devices are much shorter and the inductance between the lines more closely controlled because of the transmission effect of the voltage planes. This insures an optimized balance between signal delay and cross-talk. The structure also allows the elimination of terminating resistors for transmission lines which connect circuit chips on the same miniature board substrate.

While we have illustrated and described the preferred embodiment of our invention, it is to be understood that we do not limit ourselves to the concise construction herein disclosed and the right is reserved to all changes and modifications coming within the scope of the invention as defined in the appendant claims.

What is claimed is:

1. A package for mounting, interconnecting, and cooling a large number of sophisticated integrated circuit semiconductor devices comprising a sintered multilayer ceramic substrate of a material having a coefficient of expansion that substantially matches the coefficient of expansion of silicon, said substrate provided with an internal metallurgy network made up of voltage planes, X and Y signal planes, and fan-out planes, said substrate further provided with input/output pins on the bottom surface, and a plurality of asymmetrical solder pad clusters for solder bonding to a plurality of integrated circuit semiconductor devices, a plurality of integrated circuit semiconductor devices solder bonded to said solder pad clusters, at least one row of elongated engineering change pads surrounding each pad cluster, said internal metallurgy network including conductive lines in said fan-out planes joining a solder pad connected to a signal terminal of a device to one end of one of said elongated engineering change pads, and a line joined to the other end of said engineering pads joined to the said internal metallurgy network, the intermediate section of said elongated engineering change pads serving as a severable surface link, said internal metallurgy network arranged with said conductive voltage planes positioned above and below at least one pair of said signal planes in the X and the Y direction to thereby obtain a transmission line effect for the signal lines which confines the electric fields, said input/output pins connected to said internal network arranged in clusters with the powering voltages of each semiconductor device located directly beneath the device thereby minimizing the voltage drops, and signals connected through input/output pins interspersed between said clusters of power input/output pins, a cap forming an enclosure over at least the top surface of said ceramic substrate, a rectangular annular flange element having an inside surface brazed to said ceramic substrate and having a portion extending outwardly beyond the edge of said substrate, said cap provided with a seating surface contacting said extending portion of said flange, a clamping member engaging said extending portion of said flange and maintaining it in engagement with said seating surface, and a cooling means associated with said cap for removing heat from said devices.

2. The package of claim 1 wherein said cooling means is comprised:

plurality of fins disposed on the interior of said cap, and a body of cooling fluid disposed within said cap in contact with said devices mounted on the top surface of said substrate.

3. The package of claim 1 wherein said engineering change pads are arranged in two concentric rows above each cluster of solder pads.

4. The package of claim 1 wherein there is included discrete wires joined at the ends to said engineering change pads.

5. The package of claim 1 which includes electrically floating pads in said rows of elongated engineering change pads.

* * * * *